United States Patent
Cho et al.

(10) Patent No.: US 8,656,199 B2
(45) Date of Patent: Feb. 18, 2014

(54) POWER-DOWN METHOD FOR SYSTEM HAVING VOLATILE MEMORY DEVICES

(75) Inventors: Beom-Sig Cho, Hwaseong-Si (KR); Tae-Sik Son, Seongnam-Si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 439 days.

(21) Appl. No.: 12/966,039

(22) Filed: Dec. 13, 2010

(65) Prior Publication Data

US 2011/0219248 A1 Sep. 8, 2011

(30) Foreign Application Priority Data

Mar. 4, 2010 (KR) ........................ 10-2010-0019484

(51) Int. Cl.
*G06F 1/26* (2006.01)
*G06F 1/32* (2006.01)

(52) U.S. Cl.
USPC ........... 713/323; 713/300; 713/320; 711/100; 711/170

(58) Field of Classification Search
USPC .................. 713/300, 320, 323; 711/100, 170
See application file for complete search history.

(56) References Cited

U.S. PATENT DOCUMENTS

| | | | |
|---|---|---|---|
| 6,336,161 B1 * | 1/2002 | Watts | ............................ 711/103 |
| 6,343,043 B2 | 1/2002 | Kai et al. | |
| 6,349,068 B2 | 2/2002 | Takemae et al. | |
| 2007/0033338 A1 * | 2/2007 | Tsern | ............................ 711/106 |

FOREIGN PATENT DOCUMENTS

| | | |
|---|---|---|
| JP | 2005-011434 | 1/2005 |
| JP | 2005-122900 | 5/2005 |
| JP | 2007-280608 | 10/2007 |

* cited by examiner

*Primary Examiner* — Kim Huynh
*Assistant Examiner* — Michael J Brown
(74) *Attorney, Agent, or Firm* — Muir Patent Consulting, PLLC

(57) ABSTRACT

A power-down method for a system including a plurality of volatile memory devices is disclosed. The method includes providing some of the plurality of volatile memory devices or some memory regions of the volatile memory devices to operate in a self-refresh mode, thereby increasing a rebooting operation speed and reducing power consumption.

9 Claims, 3 Drawing Sheets

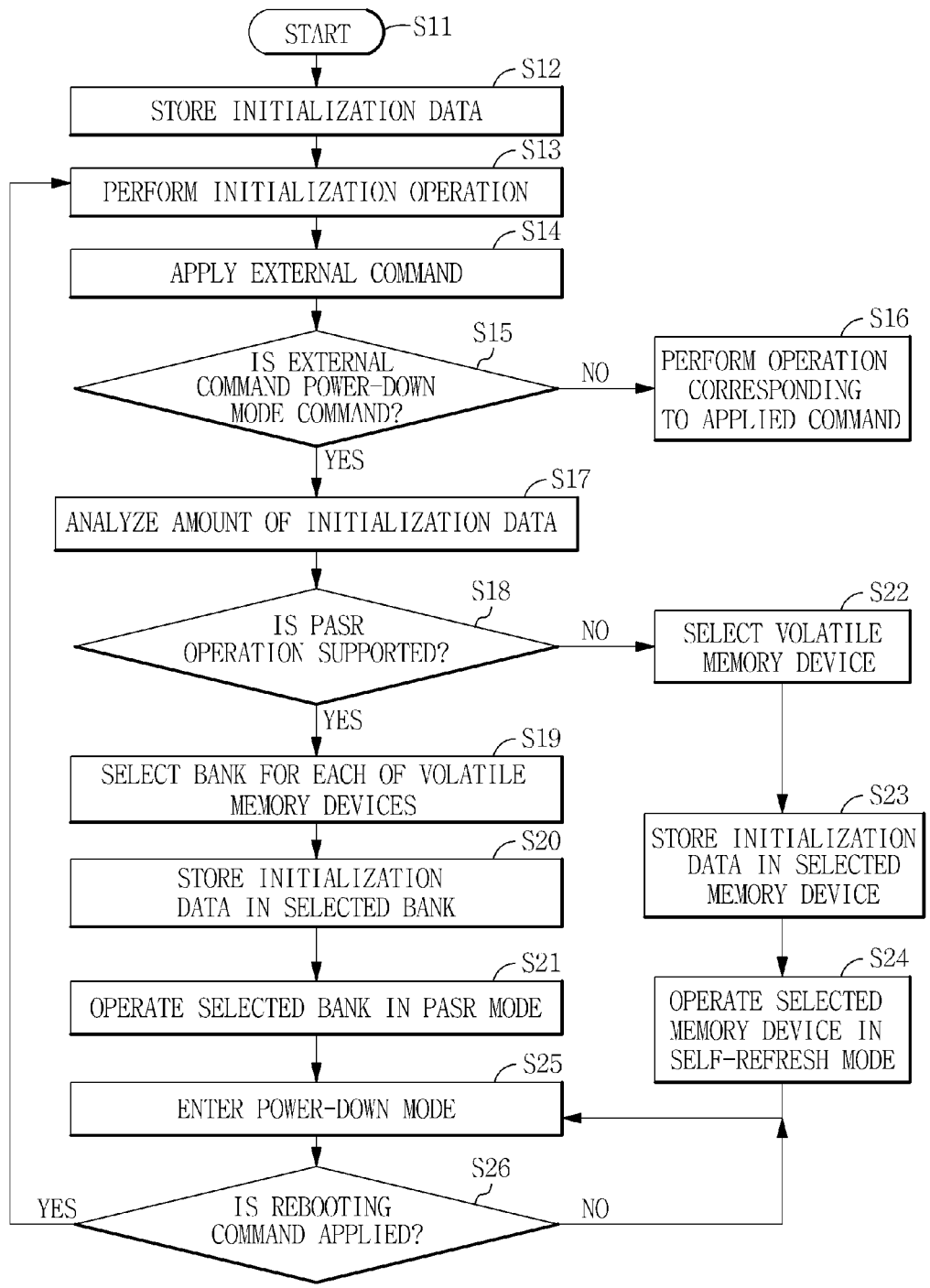

POWER-DOWN METHOD FOR SYSTEM HAVING VOLATILE MEMORY DEVICES

CROSS-REFERENCE TO RELATED APPLICATION

This application claims priority under 35 U.S.C. §119 to Korean Patent Application No. 10-2010-0019484 filed on Mar. 4, 2010, in the Korean Intellectual Property Office (KIPO), the disclosure of which is hereby incorporated by reference in their entirety.

BACKGROUND

1. Technical Field

Example embodiments relate to a method for reducing power consumption and, more particularly, to a power-down method for a system having volatile memory devices.

2. Description of Related Art

Rapid development in digital apparatuses has led to a sharp increase in the amount of data to be processed by various systems using digital information. Also, to facilitate the processing of increased data, the various systems may include volatile memory devices with larger capacities or a larger number of volatile memory devices. In spite of an increase in the memory capacity of a system, the sharp increase in the amount of data may greatly affect the operation speed of the system especially when the system performs an initialization operation (e.g., booting operation) to process a large amount of data. For example, it may take about seven seconds or more for the system (e.g., a recently developed digital TV) to perform an initialization operation. Since an increase in an initialization time of a system weakens competitiveness, a method for shortening the initialization time of the system may be required.

Thus, to reduce an initialization time of a system, a method of operating volatile memory devices included in the system in a self-refresh mode to retain data when the system enters a power-down mode has been proposed. Recently developed systems may provide various power-down modes, such as a deep power-down mode, so that the systems can be booted using a remote controller even in the power-down mode, and a standby power may be supplied to the systems in the deep power-down mode. Thus, even in the power-down mode, the systems may set the volatile memory devices included therein to a self-refresh mode using a standby power to retain data, and be rebooted using the retained data so that a data loading speed can be reduced to increase an initialization speed.

However, as environmental problems are at issue, regulation of standby-power consumption has been strengthened. When the system is in the power-down mode, power consumed by a volatile memory device to perform a refresh operation in the power-down mode may take up a large part of the entire standby power.

SUMMARY

Some example embodiments provide a power-down method for a system including a plurality of volatile memory devices.

In one embodiment, a power-down method for a system including a plurality of volatile memory devices includes: analyzing initialization data when a power-down mode command is applied; selecting a volatile memory device to be store the initialization data out of the plurality of volatile memory devices, and storing the initialization data in the selected volatile memory device; and setting the selected volatile memory device to a first mode, and setting unselected volatile memory devices to a second mode in which power consumption is less than in the first mode.

The selection of the volatile memory device may include selecting at least one volatile memory device other than the selected volatile memory device when a previous power-down mode command is applied.

The first mode may be a self-refresh mode, and the second mode may be a deep power-down mode.

When the amount of initialization data corresponds to at least one of a plurality of banks of the selected volatile memory device, the selection of the volatile memory device may include selecting the bank corresponding to the amount of initialization data.

The selection of the volatile memory device may include selecting at least one bank other than the selected bank when a previous power-down mode command is applied.

Storing the initialization data may include storing the initialization data in the selected bank.

The first mode may be a partial array self-refresh (PASR) mode in which the selected bank of the selected volatile memory device is self-refreshed, and the second mode may be a deep power-down mode.

The selection of the volatile memory device may include selecting at least one bank from each of the plurality of volatile memory devices.

The method may further include: entering a power-down mode when the plurality of volatile memory devices are set to the first and second modes; and rebooting the system using the initialization data stored in the selected volatile memory device.

The initialization data may be configured to increase a rebooting operation speed.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIG. 3 is a flowchart illustrating operation of a system according to example embodiments.

DETAILED DESCRIPTION OF THE EMBODIMENTS

Figure 1:
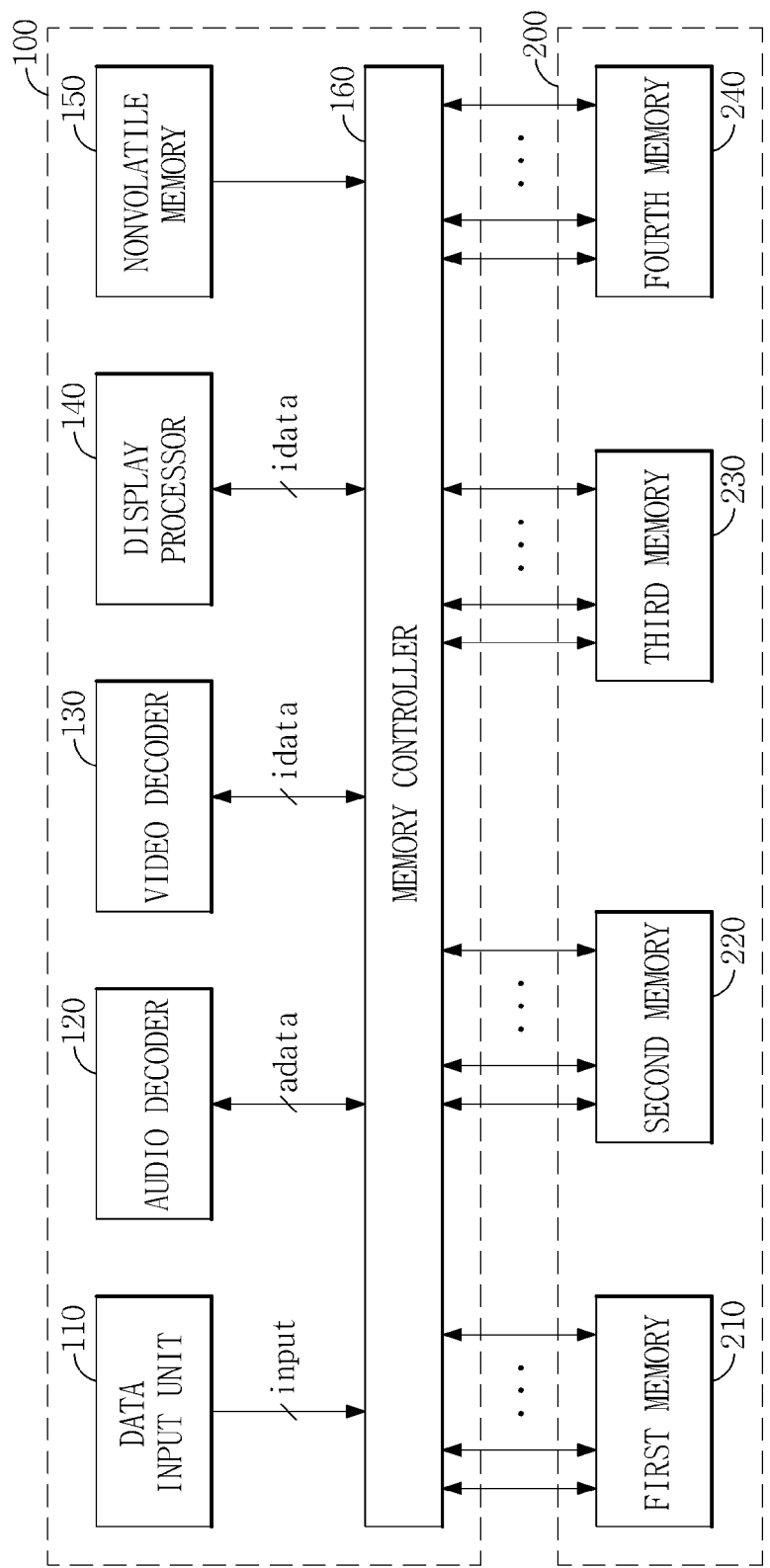
FIG. 1 is a block diagram of a system having volatile memory devices according to example embodiments.

Various embodiments will now be described more fully with reference to the accompanying drawings in which some embodiments are shown. These embodiments disclosed herein may, however, be embodied in different forms and should not be construed as limited to the embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein A power-down method for a system including volatile memory devices according to example embodiments will now be described more fully with reference to the accompanying drawings in which some embodiments of the inventive concept are shown.

FIG. 1 is a diagram of a system including a plurality of volatile memory devices according to example embodiments. FIG. 1 shows a digital TV as an example of various systems including a plurality of volatile memory devices.

FIG. 1 illustrates a controller 100 and a memory portion 200, which corresponds to a portion of the system. The controller 100 may be fabricated as a system-on-chip (SoC) type and include a data input unit 110, an audio decoder 120, a video decoder 130, a display processor 140, a nonvolatile memory 150, and a memory controller 160. The data input unit 110 may decode an externally applied input signal and output input data "input" to the memory controller 160. Also, the audio decoder 120 and the video decoder 130 may receive audio data adata and image data idata from the data input unit 110 through the memory controller 160, decode the audio data adata and the image data idata, and output the decoded audio data and image data to the memory controller 160. The display processor 140 may receive the input data "input" and the image data idata through the memory controller 160 and perform additional functions. For example, the display processor 140 may output sub-images or add subtitles. Thereafter, the display processor 140 may drive a panel (not shown) to output an image. The nonvolatile memory 150 may store initialization data for initializing the system and various settings and output the stored data to the memory controller 160 during initialization of the system.

In FIG. 1, the data input unit 110, the audio decoder 120, the video decoder 130, the display processor 140, and the volatile memory 150 may be included in a processor of the system and variously configured according to the purpose and design of the system. That is, although the digital TV is taken as an example of the system, when the system is an apparatus with another purpose, some processors may be removed, and various processors may be further added to the system. For example, when the system is a navigation system for vehicles, the system may further include a global positioning system (GPS) processor with a GPS function.

Also, the memory controller 160 may store data applied from the data input unit 110, the audio decoder 120, the video decoder 130, the display processor 140, and the volatile memory 150 in a plurality of volatile memory devices 210 to 240, and output the data stored in the plurality of volatile memory devices 210 to 240 to the audio decoder 120, the video decoder 130, and the display processor 140. In particular, when input data "input" applied from the data input unit 110 is a power-mode command, the memory controller 160 may measure the amount of initialization data required for initialization, select at least one volatile memory device out of the plurality of volatile memory devices 210 to 240, store the initialization data of the system out of data stored in the plurality of volatile memory devices 210 to 240 in the at least one selected volatile memory. That is, when a power-down mode command is applied, the memory controller 160 may concentrate and store initialization data, which is dispersed and stored in the plurality of volatile memory devices 210 to 240, in the at least one selected volatile memory device.

In this case, the number of selected volatile memory devices may be controlled by the memory controller 160 according to the amount of initialization data to be stored. That is, when the amount of initialization data does not exceed the data capacity of one of the plurality of volatile memory devices 210 to 240, the memory controller 160 may select only one volatile memory device and store the initialization data in the selected volatile memory device. However, when the amount of initialization data exceeds the data capacity of each of the plurality of volatile memory devices 210 to 240, the memory controller 160 may select several volatile memory devices corresponding to the amount of initialization data and store the initialization data. Therefore, the memory controller 160 may set the selected volatile memory device to the self-refresh mode and set the unselected volatile memory devices to the power-down mode or deep power-down mode.

Therefore, when the system including the volatile memory device according to some example embodiments enters a power-down mode, only the volatile memory device selected by the memory controller 160 may operate in the self-refresh mode, while the remaining volatile memory devices may operate in the power-down mode or the deep power-down mode. Thus, the system may be initialized at high speed using data stored in the selected volatile memory device during a rebooting operation and minimize unnecessary power consumption in the power-down mode.

Meanwhile, when the memory controller 160 always select the same volatile memory device (e.g., first memory 210) and stores initialization data each time the system enters a power-down mode, the frequency in the use of the selected volatile memory device may be increased, thereby causing memory degradation. When a malfunction occurs due to the degradation of one volatile memory device 210 of the plurality of volatile memory devices, the malfunction may occur in the entire system. Therefore, the degradation of the volatile memory device should be prevented for stability of the system.

In order to prevent the degradation of the at least one volatile memory device, the memory controller 160 may select different volatile memory devices 210 to 240 each time the system enters the power-down mode. That is, the memory controller 160 may sequentially select the plurality of volatile memory devices 210 to 240 such that the plurality of volatile memory devices 210 to 240 are selected in a ratio of 1:1:1:1.

Figure 2:
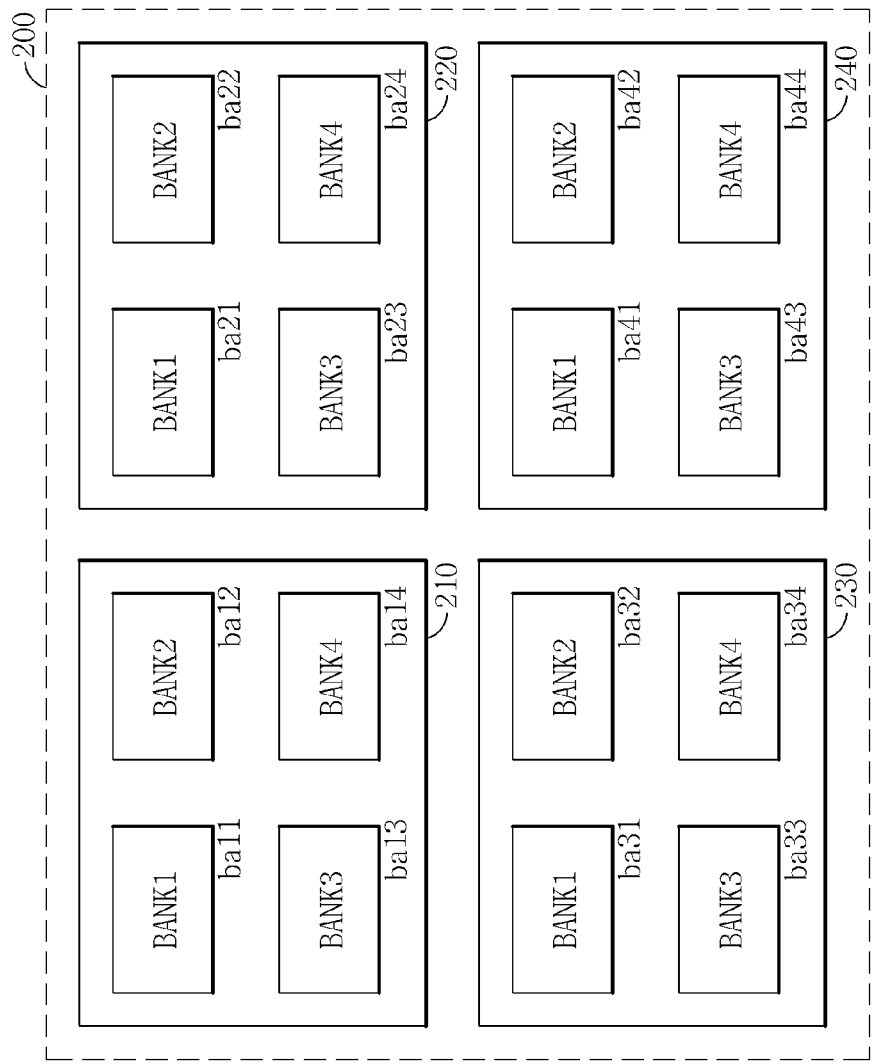
FIG. 2 is a diagram of a plurality of volatile memory devices of FIG. 1.

FIG. 2 is a diagram of the plurality of volatile memory devices of FIG. 1. Referring to FIG. 2, the plurality of volatile memory devices 210 to 240 may include four banks (ba11~ba14), (ba21~ba24), (ba31~ba34), and (ba41~ba44), respectively.

In recent years, with an increase in data capacity, the volatile memory devices 210 to 240 may include a plurality of banks (ba11~ba14), (ba21~ba24), (ba31~ba34), and (ba41~ba44) and support a partial array self-refresh (PASR) operation to allow only some of the plurality of banks to be self-refreshed. In the PASR operation, each of the volatile memory devices 210 to 240 may allow only at least one selected bank to be self-refreshed without self-refreshing the unselected remaining banks, thereby reducing power consumption. Also, banks to be self-refreshed and the number of banks to be self-refreshed may be selected by the memory controller 160.

Accordingly, even when the memory controller 160 of FIG. 1 selects a different volatile memory device each time the system enters the power-down mode, stores initialization data in the selected volatile memory device, performs a self-refresh operation to equalize the frequencies in the use of a plurality of volatile memory devices so as to prevent the degradation of the system, the respective volatile memory devices 210 to 240 may perform the PASR operation to prevent the degradation of the system. FIG. 2 illustrates that each of the volatile memory devices 210 to 240 includes four banks Thus, when one bank is selected out of each of the four volatile memory devices 210 to 240, for example, when banks ba11, ba21, ba31, and ba41 are selected out of the volatile memory devices 210 to 240, the system may have the same data capacity as when one volatile memory device 210 is selected. In other words, when the memory controller 160 selects one bank out of each of the plurality of volatile memory devices 210 to 240, the system may have the same data capacity as when the memory controller 160 selects one volatile memory device. Furthermore, since the plurality of volatile memory devices 210 to 240 are connected in parallel to the memory controller 160 and receive and transmit data, the system may be initialized at high speed so that the transmission rate of the data may be increased more than when one volatile memory device is selected.

Specifically, when the memory controller 160 enters the power-down mode, the memory controller 160 may select at least one bank from each of the plurality of volatile memory devices 210 to 240 and store the initialization data in the selected bank. In this case, the memory controller 160 may control the number of banks selected out of each of the volatile memory devices 210 to 240 according to the amount of initialization data. Also, the memory controller 160 may transmit a PASR command to each of the volatile memory devices 210 to 240 so that only selected banks can be self-refreshed. Thus, all the volatile memory devices 210 to 240 perform a PASR operation in the power-down mode of the system, so that the frequencies in the use of the volatile memory devices 210 to 240 may be equalized.

However, in the same manner as when the memory controller 160 repetitively selects the same volatile memory device causing the degradation of the system, when the same banks are always selected out of the plurality of volatile memory devices 210 to 240 to perform the PASR operation, the selected banks may be used at a higher frequency than the remaining banks, thereby degrading the system. Thus, the memory controller 160 may control the plurality of volatile memory devices 210 to 240 such that different banks are selected out of the plurality of volatile memory devices 210 to 240 to perform the PASR operation each time the system enters the power-down mode.

Also, the memory controller 160 may minimize a region to be self-refreshed using the PASR function of the volatile memory devices 210 to 240, thereby further reducing power consumption.

When each of the volatile memory devices 210 to 240 has a data capacity of 512 MB and each of the volatile memory devices 210 to 240 has four banks, each of the banks (ba11~ba14), (ba21~ba24), (ba31~ba34), and (ba41~ba44) may have a data capacity of 128 MB. Assuming that the amount of initialization data is 600 MB, the memory controller 160 should select two volatile memory devices 210 and 220 and store the initialization data in the selected volatile memory devices 210 and 220. Here, all the banks ba11 to ba14 of one volatile memory device 210 may store data, while only one bank ba21 of the other volatile memory device 220 may store data. In this case, when each of the volatile memory devices 210 to 240 does not support a PASR operation, the memory controller 160 should control all banks (ba11~ba14) and (ba21~ba24) of the two volatile memory devices 210 and 220 to perform the self-refresh operation. However, when each of the volatile memory devices 210 to 240 supports the PASR operation, one volatile memory device 210 may allow all the banks ba11~ba14 to be refreshed, while the remaining volatile memory device 220 may allow only the bank ba21 in which data is stored to be self-refreshed, thereby reducing power consumption.

Similarly, when the memory controller 160 stores initialization data in at least one bank of each of the plurality of volatile memory devices 210 to 240, the number of banks to be partially self-refreshed may be determined differently according to each memory. That is, first banks ba11, ba21, ba31, and ba41 of the respective volatile memory devices 210 to 240 and the second bank ba12 of the volatile memory device 210 may be selected and partially self-refreshed, thereby further lessening power consumption.

FIG. 3 is a flowchart illustrating operation of a system according to example embodiments.

To begin with, when the system starts operating in operation S11, the system may store initialization data required for initialization of the nonvolatile memory device 150 in the plurality of volatile memory devices 210 to 240 of the memory unit 200 (operation S12). The system may be initialized based on the initialization data stored in the volatile memory devices 210 to 240 (operation S13). When an external command is applied (operation S14), it is determined whether the external command is a power-down mode command (operation S15). When it is not determined that the applied command is not the power-down mode command, the system may perform an operation corresponding to the applied command (operation S16).

However, when the applied command is the power-down mode command, the memory controller 160 may analyze the amount of initialization data (operation S17). In this case, the initialization data may be the same as or different from initialization data applied from the nonvolatile memory device 150 and stored in the volatile memory devices 210 to 240. After the first initialization operation, the system may perform an operation in response to the external command (operation S15), and various settings may be changed. Subsequently, the system may be rebooted according to the changed settings for the convenience of users. For example, while a user is watching a digital TV, channels and volume may be controlled. Also, the digital TV may be rebooted with the channel and volume finally selected by the user. Thus, the initialization data analyzed by the memory controller 160 may be different from the data applied from the nonvolatile memory device 150 and stored in the volatile memory devices 210 to 240 in substance and amount.

After analyzing the amount of initialization data (operation S17), the memory controller 160 may determine whether the volatile memory devices 210 to 240 support the PASR operation (operation S18). When the volatile memory devices 210 to 240 support the PASR operation as described above, power consumption may be further reduced. When the volatile memory devices 210 to 240 support the PASR operation, the memory controller 160 may select at least one bank corresponding to the amount of analyzed initialization data from the plurality of volatile memory devices 210 to 240 (operation S19). In this case, as described above, the memory controller 160 may select a different bank from the bank selected during entry into a previous power-down mode. The memory controller 160 may store the initialization data in the selected bank (operation S20), and control the volatile memory devices 210 to 240 to operate the selected banks in the PASR mode (operation S21). When the selected banks operate in the PASR mode, the system may enter the power-down mode (operation S25).

Meanwhile, when the volatile memory devices 210 to 240 do not support the PASR operation, the memory controller 160 may select at least one volatile memory device corresponding to the amount of analyzed initialization data (operation S22) and store the initialization data in the selected volatile memory device (operation S23). The memory controller 160 may control the selected volatile memory device to operate in a self-refresh mode, and control the unselected volatile memory devices to operate in a deep power-down mode. When the selected volatile memory device operates in the self-refresh mode, the system may enter the power-down mode (operation S25).

Thereafter, the system may determine whether a rebooting command is applied (operation S26). When the rebooting command is not applied, the system may remain in the power-down mode. Also, when the rebooting command is applied, the system may be initialized again using the initialization data stored in the selected bank or volatile memory device (operation S13).

As described above, the initialization data may include not only data stored in the nonvolatile memory device 150 but also various data required for accelerating a rebooting operation of the system. For example, when the system according to the example embodiments is applied to a navigation system, GPS information may be stored as the initialization data in the volatile memory devices 210 to 240. It may take a considerable amount of time for the navigation system to confirm GPS positional information during an initialization operation. In the case of a navigation system for vehicles, GPS positional information confirmed in the power-down mode may be generally the same as GPS positional information confirmed during a rebooting operation. Accordingly, after the GPS positional information confirmed in the power-down mode of the system is stored, when the system is initialized using the GPS positional information stored in the rebooting operation, an initialization time of the navigation system may be greatly reduced.

Although it is described that the memory controller 160 analyzes initialization data and selects the volatile memory devices 210 to 240 based on the analyzed initialization data, at least one volatile memory device for storing the initialization data may be previously determined. That is, the memory unit 200 may have at least one volatile memory device designated as an initialization memory device and store the initialization data in the at least one designated volatile memory device. Also, the memory device 20 may have two or more volatile memory devices capable of storing initialization data designated as initialization memory devices when the amount of initialization data exceeds the memory capacity of a single initialization memory device. These designated initialization memory device may store data other than the initialization data during a normal operation.

Although it is described that a PASR operation of a volatile memory device is set in bank units, the PASR operation may be performed in units of blocks included in each of the banks.

As described above, according to a power-down method of a system including a plurality of volatile memory devices, when the system enters a power-down mode, initialization data may be stored in some of the plurality of volatile memory devices or some memory regions of the respective volatile memory devices, and only regions where data is stored may be self-refreshed so that the system can be initialized in a short amount of time and standby-power consumption can be reduced.

The foregoing is illustrative of example embodiments and is not to be construed as limiting thereof. Although a few embodiments have been described, those skilled in the art will readily appreciate that many modifications are possible in the example embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other example embodiments, are intended to be included within the scope of the appended claims.

What is claimed is:

1. A power-down method for a system including a plurality of volatile memory devices, the method comprising:
analyzing initialization data when a power-down mode command is applied;
selecting a volatile memory device out of the plurality of volatile memory devices to store the initialization data, and storing the initialization data in the selected volatile memory device; and
setting the selected volatile memory device to a first mode, and setting unselected volatile memory devices to a second mode in which power consumption is less than in the first mode,
wherein, when the amount of initialization data corresponds to at least one of a plurality of banks of the selected volatile memory device, selecting the volatile memory device comprises selecting the bank corresponding to the amount of initialization data.

2. The method of claim 1, wherein selecting the volatile memory device comprises selecting at least one volatile memory device other than the selected volatile memory device when a previous power-down mode command is applied.

3. The method of claim 1, wherein the first mode is a self-refresh mode, and the second mode is a deep power-down mode.

4. The method of claim 1, wherein selecting the volatile memory device comprises selecting at least one bank other than the selected bank when a previous power-down mode command is applied.

5. The method of claim 4, wherein storing the initialization data comprises storing the initialization data in the selected bank.

6. The method of claim 5, wherein the first mode is a partial array self-refresh (PASR) mode in which the selected bank of the selected volatile memory device is self-refreshed, and the second mode is a deep power-down mode.

7. The method of claim 6, wherein selecting the volatile memory device comprises selecting at least one bank from each of the plurality of volatile memory devices.

8. The method of claim 1, further comprising:
entering a power-down mode when the plurality of volatile memory devices are set to the first and second modes; and
rebooting the system using the initialization data stored in the selected volatile memory device.

9. The method of claim 8, wherein the initialization data is data configured to increase a rebooting operation speed.

* * * * *